United States Patent

Lyden et al.

[11] Patent Number: 6,137,430
[45] Date of Patent: Oct. 24, 2000

[54] MISMATCH NOISE SHAPER FOR DAC-SUBDAC STRUCTURES

[75] Inventors: Colin Lyden, Baltimore; Aidan Keady, Moycullen, both of Ireland

[73] Assignee: National University of Ireland, Cork, Cork, Ireland

[21] Appl. No.: 09/219,400

[22] Filed: Dec. 23, 1998

[30] Foreign Application Priority Data

Dec. 23, 1998 [IE] Ireland .................................. S970941

[51] Int. Cl.$^7$ ...................................................... H03M 1/66
[52] U.S. Cl. .......................... 341/145; 341/144; 341/162
[58] Field of Search .................................... 341/144, 145, 341/154, 118

[56] References Cited

U.S. PATENT DOCUMENTS

| | | | |
|---|---|---|---|
| 4,967,197 | 10/1990 | Peng ........................................ | 341/118 |
| 5,986,595 | 11/1999 | Lyden et al. ............................. | 341/118 |
| 6,037,888 | 3/2000 | Nairn ....................................... | 341/145 |

OTHER PUBLICATIONS

"Noise–shaped multibit D/A convertor employing unit elements", R. Schreier and B. Zhang, Electronic Letters, vol. 31, No. 20, pp. 1712–1713, Sep. 28, 1995.

"Tree structure for mismatch noise–shaping multibit DAC", A. Keady and C. Lyden, Electronic Letters, vol. 33, No. 17, pp. 1431–1432, Aug. 14, 1997.

"Linearity enhancement of multibit Sigma Delta converters using data weighed averaging", R.T. Baird and T. S. Fiez, IEEE Trans. Cir. & Sys. II, vol. 42, No. 12, pp. 753–762, Dec. 1995.

"A Hardware–Efficient DAC for Direct Digital Synthesis", H.T. Jensen and I. Galton, IEEE, pp. 97–100, 1996.

"Noise–Shaping D/A Converters for Sigma Delta Modulation", I. Galton, IEEE International Symposium on Cir & Sys., pp. 441–444, 1996.

Primary Examiner—Brian Young
Assistant Examiner—John B Nguyen
Attorney, Agent, or Firm—Wolf, Greenfield & Sacks, P.C.

[57] ABSTRACT

Digital to Analog convertors (DAC's) are prone to mismatch noise, particularly in DAC structures using unequally weighted segments. A digital to analog converter, for use in a data conversion system, for converting a digital input to analog output and having features for reducing mismatch noise comprises a plurality of selectable segments, at least two of which have a first weighting factor and at least two of which have a second weighting factor. The segments when selected are connected to a reference signal, with the output for each segment, when selected, being proportional to the weighting factor of the segments. Selection means select segments based on the digital input. Summing means add the output from each selected segment to produce an analog output. The number of segments having the second weighting factor is equal to at least twice the ratio of the first and second weighting factors less one. Monitoring means monitor the number of times segments having the second weighting factor are selected in a given monitoring period and generate a correction signal when this number drops below a specified target selection value. Borrow means, responsive to the correction signal of the monitoring means, reduce the number of segments selected having the first weighting factor and increase the number of segments selected having the second weighting factor.

26 Claims, 8 Drawing Sheets

MISMATCH NOISE SHAPER FOR DAC-SUBDAC STRUCTURES

BACKGROUND OF THE INVENTION

1. Field of the Invention

This invention relates to mismatch noise shaping, in particular for digital-in-analog converters, subsequently referred to as DACs.

The invention relates especially to an efficient structure for "mismatch" noise shaping for DACs which have unequally weighted segments.

2. Description of the Prior Art

A simple DAC structure 1 is shown in FIG. 1. This seven segment DAC converts a 3 bit code 2(DAC input code [2:0]) into a corresponding analog signal 3 (Iout). The possible digital input 2 will range from 000 to 111 binary (decimal range 0–7). The segment selection logic 4 determines the DAC segments to be selected based on the digital input to the DAC, e.g. if the DAC input is 011 (binary) (decimal equivalent 3) then the segment selection logic will select 3 of the segments. This will produce an analog output of Iout equal to the sum of the currents of 3 individual segments.

In practice, there will be differences between the values of the individual segments. For example, each 1X segment value in FIG. 1 may have a nominal current output value of 1 mA. However, the individual segment values may range from 0.95 mA to 1 mA. The differences between segments is termed mismatch and the error arising from switching in and out segments having slightly different values is frequently referred to as mismatch noise.

The 5 bit DAC-subDAC structure illustrated in FIG. 2a consists of two DAC's 20, 21. The subDAC 21 illustrated functions as the DAC previously described and converts the 3 least significant bits (LSBs) of the DAC input code into an equivalent analog output signal (in this case a current). The main DAC converts the two most significant bits (MSBs) to an analog input. However, the weighting of each segment in the main DAC is eight times that of the subDAC (as the units of the DAC segments are effectively eighths, whereas the units of the subDAC are ones).

This particular arrangement will have three sources of mismatch noise:

1. The mismatch error arising between segments in the subDAC.
2. The mismatch error arising between segments in the main DAC.
3. The mismatch error arising from differences in the average values of main DAC segments and the equivalent number of subDAC segments, (e.g. if the average value for a segment in the main DAC was 8 mA and in the subDAC 1.1 mA then mismatch error would be 8×1.1−8=0.8 mA).

The R-2R DAC shown in FIG. 2b can be considered as a special case of the DAC-Sub DAC structure, in that it comprises a series of subDACs, each having different weightings, each subDAC having only one segment. In this case, the mismatch error will be restricted to that of the third class described above.

Techniques for "noise-shaping" the errors which arise from mismatch in the analog components of over-sampled data converters have recently been presented by Schreier, R. and Zhang, B: "Noise-shaped multibit D/A converter employing unit segments", Electron. Lett., 31, 1995, pp. 1712–1713, and Baird, R. T. and Fiez, T. S.: "Linearity enhancement of multibit Sigma Delta converters using data weighted averaging", IEEE Trans. Circ. & Sys. II, 1995, pp. 753–762.

The techniques have been applied to fully segmented DACs such as that of FIG. 1. The DAC output is set by selecting a number of segments to be connected to a reference voltage. The mapping of input code to selected segments is not unique. For instance, if the input code requires that two segments be selected, then any two segments can be selected. The mismatch noise shapers work by dynamically changing the mapping of input codes to segments, so that each segment's usage, within the passband of the converter, reflects the input signal. This ensures that mismatch error contributions from the individual components reflect the input signal and so appear as gain errors.

A very elegant method is to use the segments in a strict cyclic sequence, as proposed by Baird et al (above), which ensures that, on average over time, each element's usage is proportional to the input signal, with a residual noise component which is first order shaped. The use of a tree structure for the element selection algorithm is described by Galton I.: "A hardware efficient noise-shaping D/A converter", Proc. IEEE International Symposium On Circuits And Systems, May 1996. The use of such a tree structure means in addition that the digital logic overhead can be kept small, as also described by Keady A. and Lyden C.: "Tree structure for mismatch noise-shaping multibit DAC", Electron. Lett., 33, 1997, pp. 1431–1432.

Fully segmented N-bit DACs require $2^N$ elements, and so are quite large if N is 8 or more. For such higher resolutions, it is common to use a DAC-subDAC structure, as shown in FIG. 2a, or more classically an R-2R DAC, shown in FIG. 2b. These DAC structures are efficient, as they require far fewer than $2^N$ elements. However, it is not straightforward to apply mismatch noise shaping, as the elements have different weightings and so are not fully interchangeable.

It is an object of the invention to provide a technique for mismatch noise shaping DACs having a DAC-subDAC structure.

It is further an object of the invention to provide a technique for mismatch noise shaping R-2R type DAC's by treating them as a particular type of DAC-subDAC structure.

BRIEF SUMMARY OF THE INVENTION

According to the invention, there is provided a data conversion system comprising a digital to analog converter for converting a digital input code to analog output, wherein the digital to analog converter comprises a plurality of selectable segments, at least two of which have a first weighting factor and two of which have a second weighting factor, the segments when selected being connected to a reference signal, such that the output for a segment, when selected, is proportional to the weighting factor of that segment, the number of segments having the second weighting factor being equal to at least twice the ratio of the first and second weighting factors less one, selection means for selecting segments based on the digital input, summing means for adding the output from each selected segment to produce an analog output, monitoring means for monitoring the number of times segments having the second weighting factor are selected in a given monitoring period and for generating a correction signal when this number diverges from a specified target value, and correcting means responsive to said correction signal of the monitoring means to adjust the number of segments selected having the first weighting factor and to adjust the number of segments selected having the second weighting factor by an equivalent amount.

In one aspect of the invention, the correcting means is implemented as a carry means and is responsive to said correction signal of the monitoring means indicating that said number has risen above a specified target selection value to increase the number of segments selected having the first weighting factor and reduce the number of segments selected having the second weighting factor. Optionally, the digital to analog converter is implemented as at least two R-2R networks in parallel. In a variant of this the selection means further comprises an integrator and a differentiator and the carry means is implemented as a digital overflow from the integrating means.

In another aspect of the invention, the correcting means is implemented as a borrow means and is responsive to said correction signal of the monitoring means indicating that said number has fallen below said specified target selection value to reduce the number of segments selected having the first weighting factor and increase the number of segments selected having the second weighting factor.

Preferably, the target selection value is 50%.

The digital input may comprise a series of input codes. The monitoring period may equal to the duration of two input codes.

In a preferred embodiment, each digital input code is offset by a fixed digital offset prior to conversion. Preferably, the offset equals the ratio of the values of the first and second weighting factors.

The segments having said first weighting factor may be selected in a cyclic sequence. The segments having said second weighting factor may be selected in a cyclic sequence or thermometer fashion.

In a further variant of the invention the segments of said plurality of segments have at least one further weighting factor and selection of segments is effected in accordance with the methods described above from segments having any two of said first, second and further weighting factors.

The data conversion may define an analog to digital converter or a digital to analog converter.

In another aspect of the invention, there is provided a data conversion system comprising a digital to analog converter for converting a digital input to analog output, wherein the digital to analog converter comprises;

a plurality of selectable segments, at least two of which have a first weighting factor and at least two of which have a second weighting factor, the segments when selected being connected to a reference signal, with the output for each segment, when selected, being proportional to the weighting factor of that segment, and the number of segments having the second weighting factor being equal to at least twice the ratio of the first and second weighting factors less one, selection means for selecting segments based on the digital input, summing means for adding the output from each selected segment to produce an analog output, monitoring means for monitoring the number of times segments having the second weighting factor are selected in a given monitoring period and for generating a correction signal when this number drops below a specified target selection value, borrow means responsive to said correction signal of the monitoring means to reduce the number of segments selected having the first weighting factor and increase the number of segments selected having the second weighting factor.

Preferably, the target selection value is 50%.

The digital input may comprise a series of input codes. The monitoring period may equal to the duration of two input codes.

In a preferred embodiment, each digital input code is offset by a fixed digital offset prior to conversion. Preferably, the offset equals the ratio of the values of the first and second weighting factors.

The segments having said first weighting factor may be selected in a cyclic sequence. The segments having said second weighting factor may be selected in a cyclic sequence or thermometer fashion In a further variant of the invention, the segments of said plurality of segments have at least one further weighting factor and selection of segments is effected in accordance with the methods described above from segments having any two of said first, second and further weighting factors.

The data conversion may define an analog to digital converter or a digital to analog converter.

In a final aspect of the invention, there is provided a data conversion system is described comprising a digital to analog converter for converting a digital input code to analog output, wherein the digital to analog converter comprises a main DAC and a subDAC, with the main DAC converting the MSBs of the digital input code and the subDAC converting the remaining bits (LSB's) of the digital input code, wherein the subDAC comprises two R-2R networks in parallel, each R-2R network having a series of selectable switches, each switch having a different binary weighting, subDAC control means adapted to select said selectable switches in response to the digital input code, and summing means adapted to sum the resulting output of each selectable switch and the main DAC to produce an analog output.

Preferably, this data conversion system comprises a digital integrator for integrating the remaining bits of the input code prior to conversion by the subDAC, said digital integrator providing an overflow value which is summed with the MSB's prior to conversion by the main DAC, and the subDAC control means includes a differentiator for differentiating the output from the integrator.

BRIEF DESCRIPTION OF THE DRAWINGS

The invention will now be described with reference to the drawings, in which.

DETAILED DESCRIPTION OF THE DRAWINGS

Figure 3:
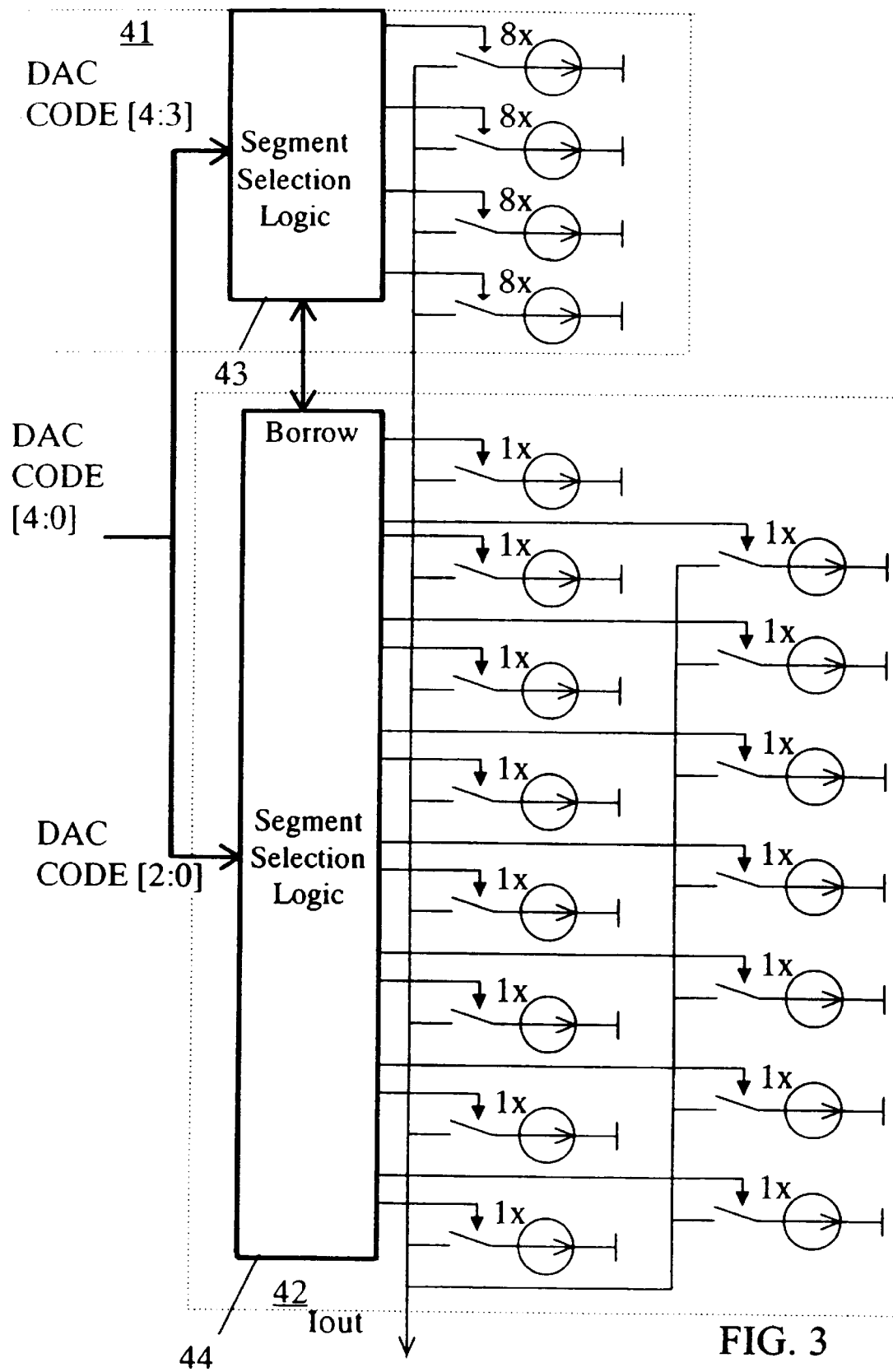
FIG. 3 shows a DAC for application of the present invention, in which two subDACs are provided.

FIG. 3 shows a structure of a 5 bit DAC according to the invention comprising a main DAC 41 and a subDAC 42. The main DAC 41 has 4 elements each with a nominal weighting of 8 and the subDAC has 15 elements each with a nominal weighting of 1.

Figure 1:
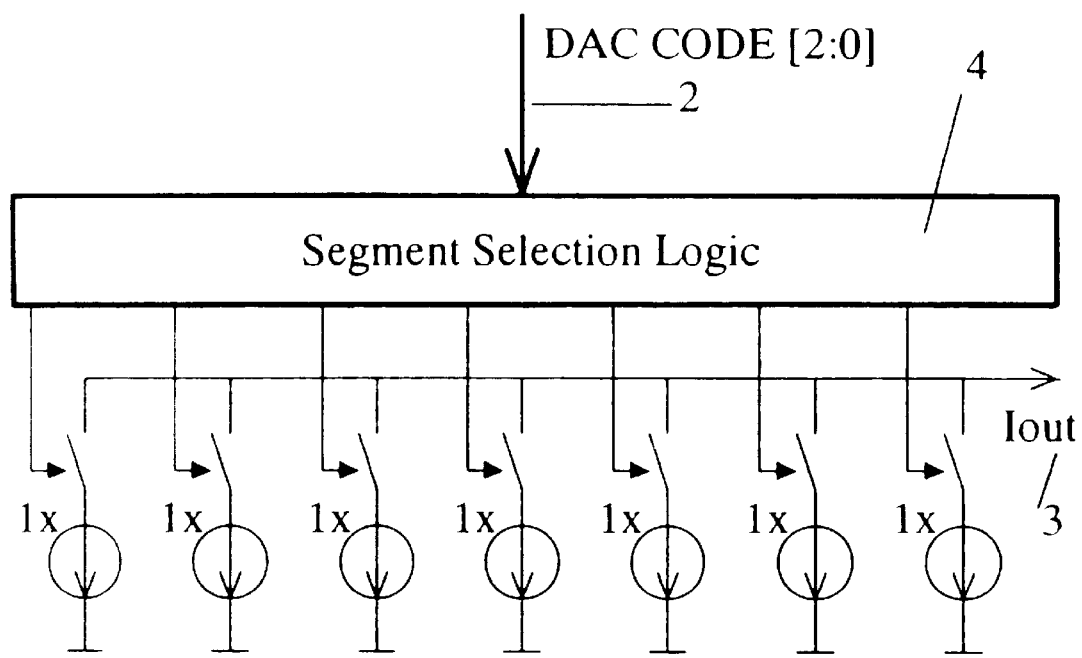
FIG. 1 shows a fully segmented DAC, as known in the art and as discussed herein above.
Figure 2A:
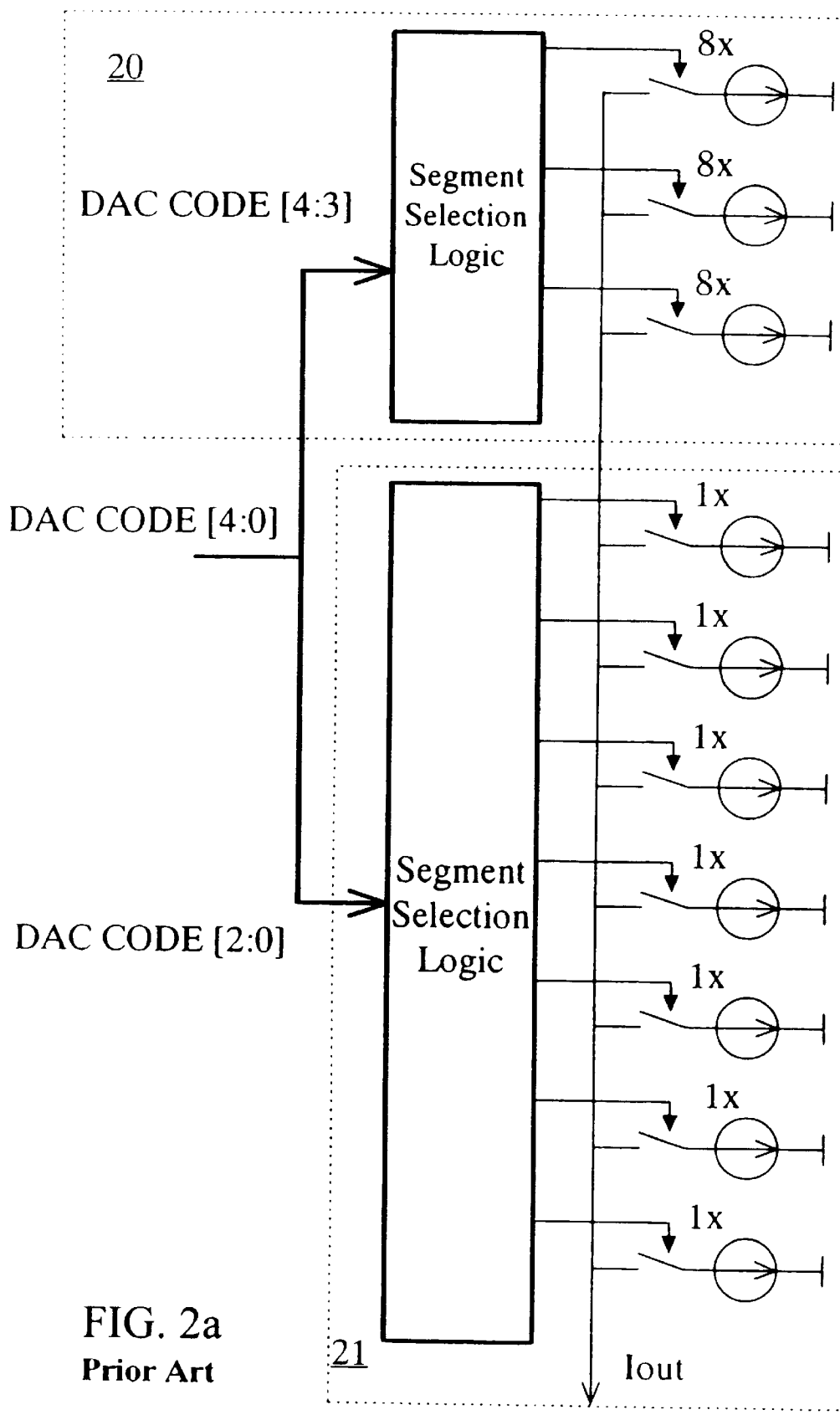
FIG. 2a shows a DAC-subDAC structure, also known in the prior art and discussed above.

This DAC has two aspects of redundancy compared to a normal 5 bit DAC-subDAC DAC as illustrated in FIG. 2a. Firstly, there are an extra eight segments in the subDAC. Secondly, there is one extra segment in the main DAC. In total, there are 9 redundant elements, representing approximately 47% of the total.

The DAC according to the present invention as embodied in FIG. 3 works as follows:

a) The two MSBs of the input code to the DAC (DAC CODE [4:3]) are allocated to the main DAC 41 and the three LSBs of the input code to the DAC (DAC CODE [2:0]) are allocated to the subDAC.

b) In a preferred embodiment, the segment selection logic circuits of the DAC and subDAC effectively change the digital input values from the normal 0–31 range to the 8–39 range. This may be achieved by adding in an additional bit to the code allocated to the main DAC. This change ensures that a minimum of one segment is selected by the DAC or subDAC. The outputs of the DAC and subDAC are summed to produce an analog output (Iout).

c) The segment selection logic 43 of the main DAC selects the required number of segments to be connected corresponding to this code. The segment selection logic also ensures that the segments in the main DAC are selected in a strictly cyclic sequence.

d) The segment selection logic 42 of the subDAC determines the number of segments that should be selected based on the input code to the subDAC i.e. the 3 LSBs of the input code. The segment selection logic may operate in a cyclic fashion (similar to the main DAC), thermometer fashion or otherwise.

e) The average rate of usage of the subDAC elements is monitored over a given period by monitoring means incorporated in the subDAC. The average rate of usage is explained best by an example. Consider that the given period is 3 samples and that the number of segments selected at each sample interval was 10, 16 and 7 segments. Then the rate of usage at the first sample would be 10/15, at the second 6/15 and at the third 9/15, giving an average rate of usage of 25/45 or 55%.

f) If the average rate of usage falls below a pre-determined value (normally 50%), then the segment selection logic of the subDAC indicates to the segment selection logic of the main DAC that a "borrow" is required. The segment selection circuit of the main DAC responds by reducing the number of selected segments in the main DAC by one.

The subDAC selection logic increases the number of segments selected in the subDAC by an amount equivalent to the ratio of the weighting factors of the main DAC and the subDAC, i.e. the subDAC increases the number of segments selected from the subDAC by eight. This borrow operation does not affect the overall DAC code, since one main DAC segment is equivalent to eight subDAC elements.

In an alternative embodiment, step f) is replaced with the alternative step of g) If the average rate of usage rises above a predetermined value (normally 50%) then the segment selection logic of the subDAC indicates to the segment selection logic of the main DAC that a "carry" is available is required. The segment selection circuit of the main DAC responds by increasing the number of selected segments in the main DAC by one.

In this alternative embodiment, the subDAC selection logic decreases the number of segments selected by the sub DAC by an amount equivalent to the ratio of the weighting factors of the main DAC and the subDAC, i.e. the subDAC decreases the number of segments selected from the subDAC by eight in the above example. This carry function does not affect the overall DAC code, since one main DAC segment is equivalent of eight subDAC elements.

The use of the above methods reduces mismatch noise from the main DAC by using the elements in a cyclic fashion.

The effective selection of the subDAC elements at a constant average rate ensures that these errors will appear as constant offsets plus some first order shaped noise. This offset will however be independent of the input signal.

The output of the DAC is however, the equivalent of 1 bit of the main DAC greater than in a normal DAC as this offset is added in to the main DAC (step b). This constant offset will be irrelevant in a large number of a applications. However, in applications where it is likely to be an issue, the analog output of the DAC as a whole may be suitably offset to account for the digital offset introduced.

The use of cycling in the main DAC, while advantageous to the operation of the DAC in terms of reducing noise, is not an essential feature of the present invention, as the borrow (or carry) function per se is effective in reducing the noise output of the DAC in the passband of the signal.

Although the above exemplary method includes the step (step b) of incrementing the input code by a number equivalent to 1 bit of the main DAC, it will be appreciated by those skilled in the art that this step is not essential. However, if this incrementing function is not performed, then the advantage of the present invention will be ineffective at input codes below the equivalent of 1 bit of the main DAC because the borrow (or carry) function will not be available.

It will further be appreciated by those skilled in the Art that the requirement for an extra segment in the main DAC is not essential to the invention. If it is omitted, however, the borrow function will not function correctly at higher input codes.

These features (incrementing of input code by one bit in main DAC and the redundant segment in the main DAC) will only have an effect if the input code is less than the equivalent of 1 bit of the main DAC or greater than the maximum minus 1 bit of the main DAC, e.g. in the example described above, the omission of the incrementing function and the redundant segment in the main DAC will have no effect if the input code is restricted from 8–24 inclusive.

12 bit Example

A further example illustrates the invention applied to a 12 bit operation. The main DAC has 128 elements. Two sub-DACs are used, each having 32 elements compared to just one in a normal DAC-subDAC structure. Weighting of the main DAC elements is 32 times that of the subDAC elements. This DAC has two aspects of redundancy. Firstly, there are twice as many subDAC elements as are needed for normal 12 bit resolution. Secondly, there is one extra element in the main DAC. In total there are 34 redundant elements, representing less than 25% of the total.

Digital logic controls the element selection according to the following algorithm. For convenience, it is assumed that the minimum allowed input code is equal to one LSB of the main DAC.

a) The seven MSBs of the input code are allocated to the main DAC and the five LSBs are allocated to the subDACs. The outputs of the main DAC and the subDAC are summed to produce an analog output.
b) The elements of the main DAC are used in a strict cyclic sequence. Digital logic for such a sequence is described by Baird et al (above).
c) The two subDACs are treated as one large subDAC, and their elements are used in a strict cyclic sequence.
d) The cycle rate of the subDAC element selection sequence is monitored.

If the rate falls below one full rotation every two clock cycles, corrective action is taken. The subDACs "borrow" an LSB from the main DAC, reducing the main DAC code by 1 and increasing the subDAC code by 32. The borrow operation does not affect the overall DAC code, since one main DAC element is equivalent to thirty-two subDAC elements.

The element selection algorithm ensures that the errors due to mismatch in the main DAC elements are first order shaped. Since the subDAC elements are, on average, selected for 50% of clock cycles, then, on average, their errors will appear as constant offsets plus some first order shaped noise. The total offset will be independent of the input signal. If the DAC is used for audio applications or within a delta sigma loop, such constant offsets are not important.

Figure 4:
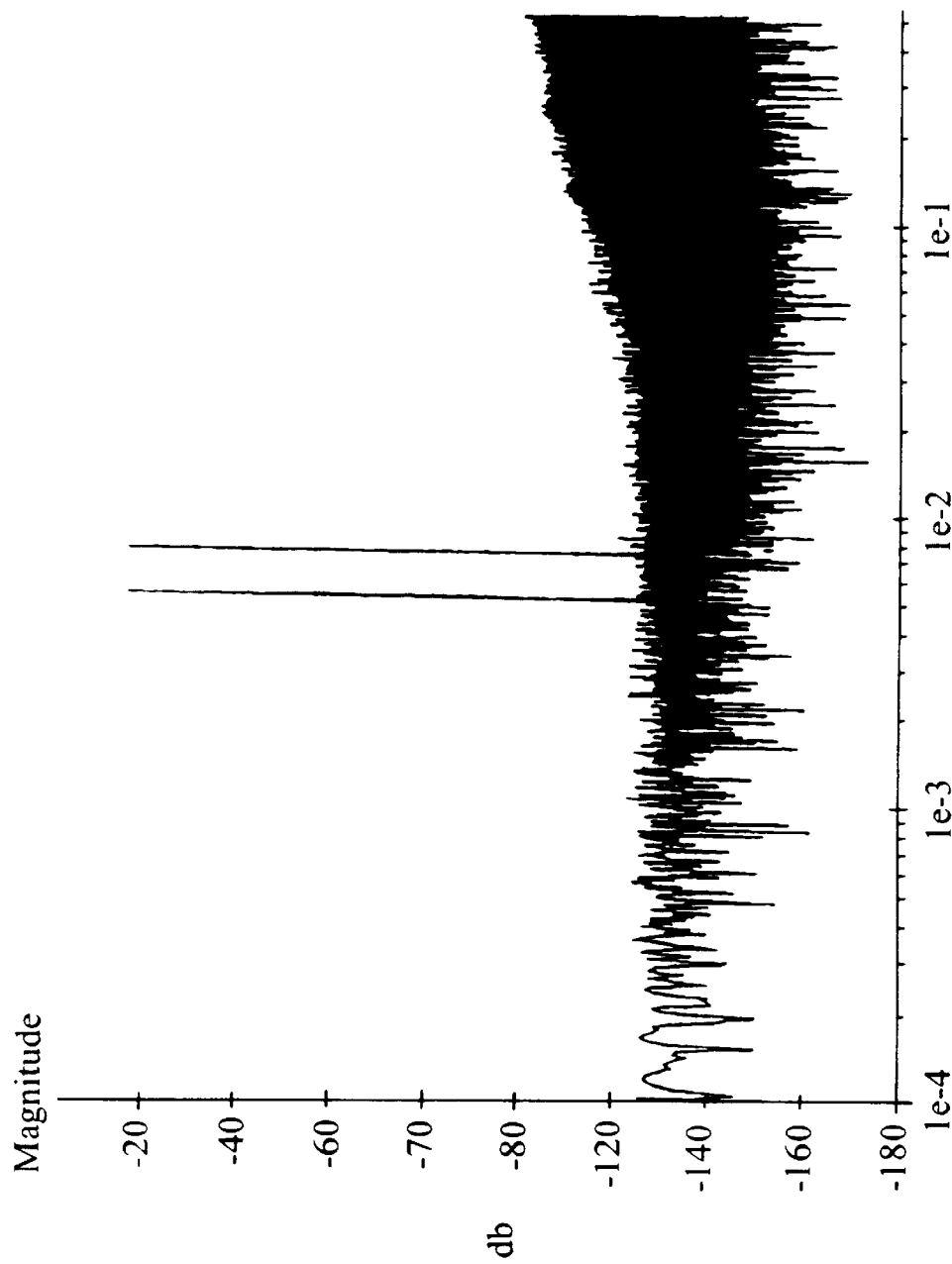
FIG. 4 shows a simulated output spectrum for a 12 bit DAC-subDAC in accordance with the principles of the present invention.

FIG. 4 shows the simulated output spectrum of a 12 bit DAC-subDAC, where the individual elements have random errors of 1%. The input consists of two pure tones. The output spectrum shows the two input tones, a noise floor due to the 12 bit quantisation and, at higher frequencies, noise due to element mismatch. This mismatch error can be seen to be first order shaped.

The algorithm described herein may be extended to second order shaping of the mismatch error. This could include banks of second order filters for the elements at the main DAC and subDAC levels. An extra second order filter may also be provided to determine when a borrow should be made from the main DAC to the subDAC.

Figure 2B:
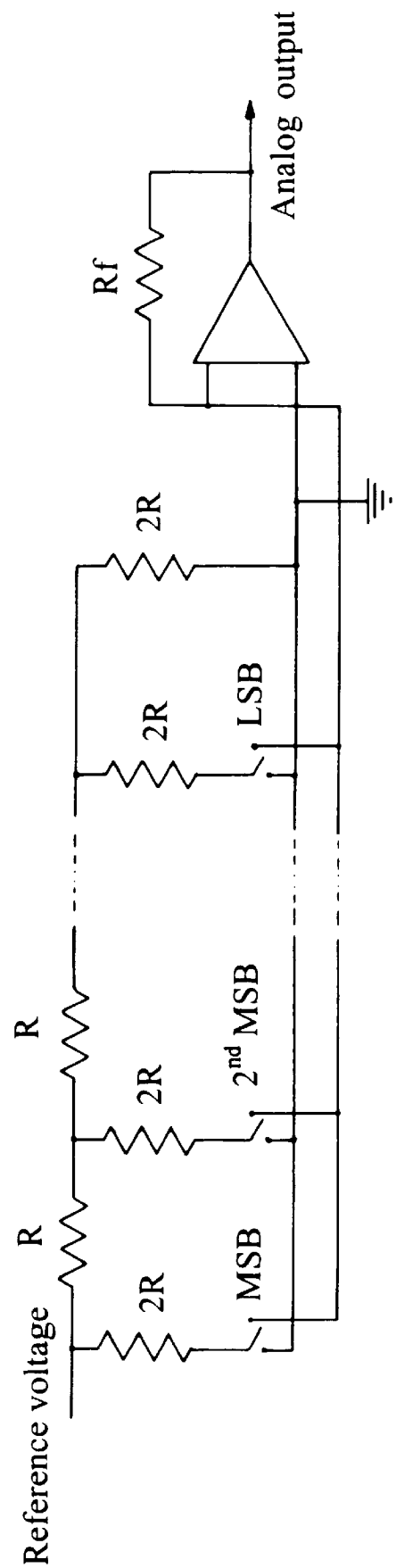
FIG. 2b shows an R-2R DAC, again known in the art and previously discussed.
Figure 5:
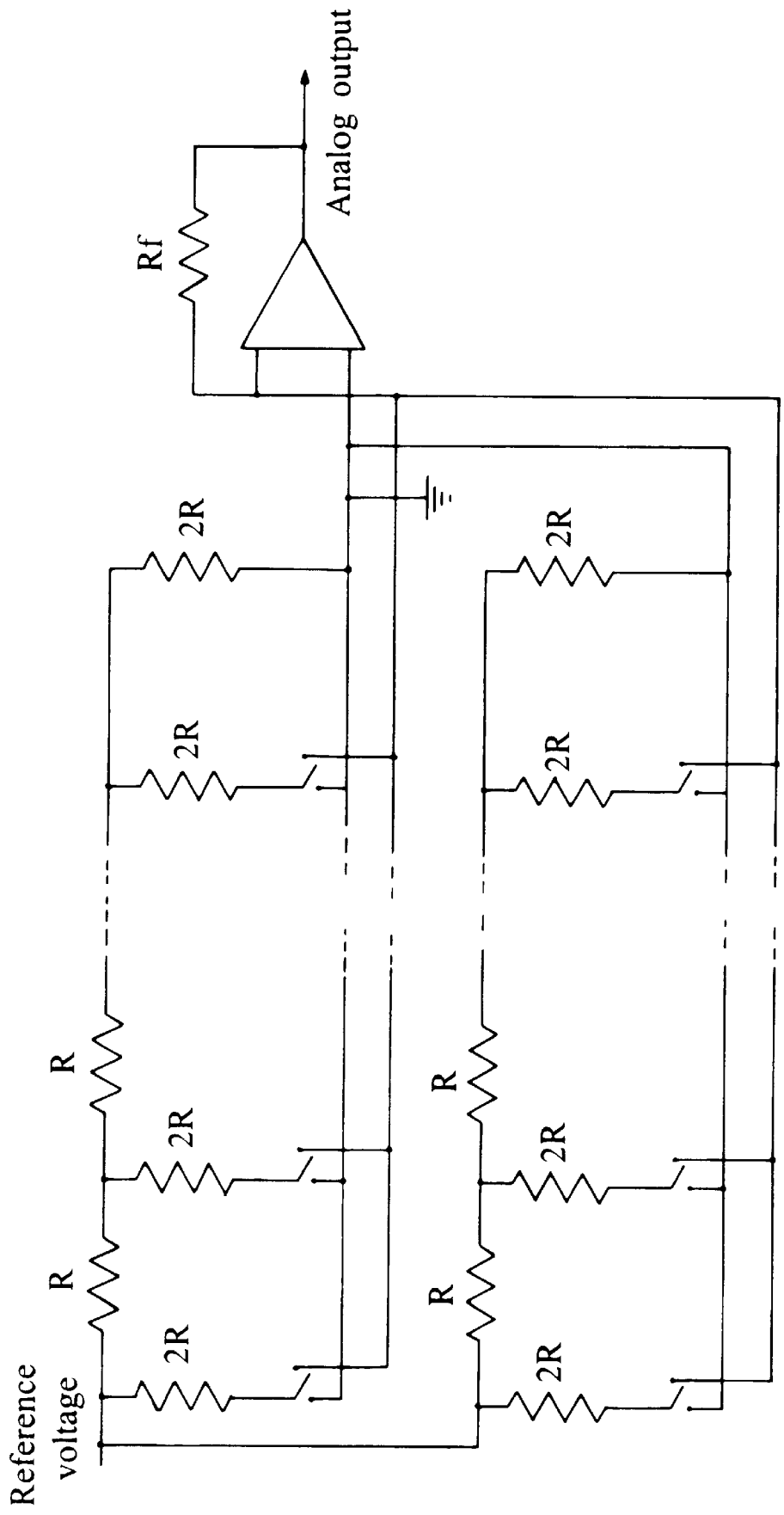
FIG. 5 shows a DAC with a redundant R-2R ladder for application of the invention in an alternative arrangement.

The technique is not limited to one level of subDAC. The classical R-2R ladder in FIG. 2b can be considered to consist of a one bit main DAC and eleven one bit subDACs, each with a different element weighting. FIG. 5 shows a DAC with a redundant R-2R ladder. In the 12 bit case, this DAC has 24 switched components. The element logic works as follows:
a) The MSBs of the input code are mapped to the top two resistors of the ladder. These elements are used in a strict cyclic sequence, as before.
b) The LSBs of the input code are mapped to corresponding levels in the ladder. The two elements at any particular level are used in a strict cyclic sequence.
c) The cycle rate of each subDAC is monitored.
d) If the cycle rate of any subDAC falls below 50%, then it borrows an LSB from the adjacent, more significant DAC, whenever the subDAC code is zero.

The borrow operation adds two to the subDAC code, so both its elements are used, and reduces the code of the adjacent DAC by one. If the borrow operation makes the adjacent DAC code negative, then it must in turn borrow two from the next higher DAC.

It will be appreciated by those skilled in the art, that the invention may be implemented using two parallel R-2R networks for the higher order bits and using a single R-2R network for lower bits. In this case, the borrow function will only operate on the higher order bits.

This algorithm works for input codes in the range [2048 . . . 6143]. For certain applications, a mapping of the input code to this range and the removal of the resultant systematic offset from the output signal is necessary.

Figure 6:
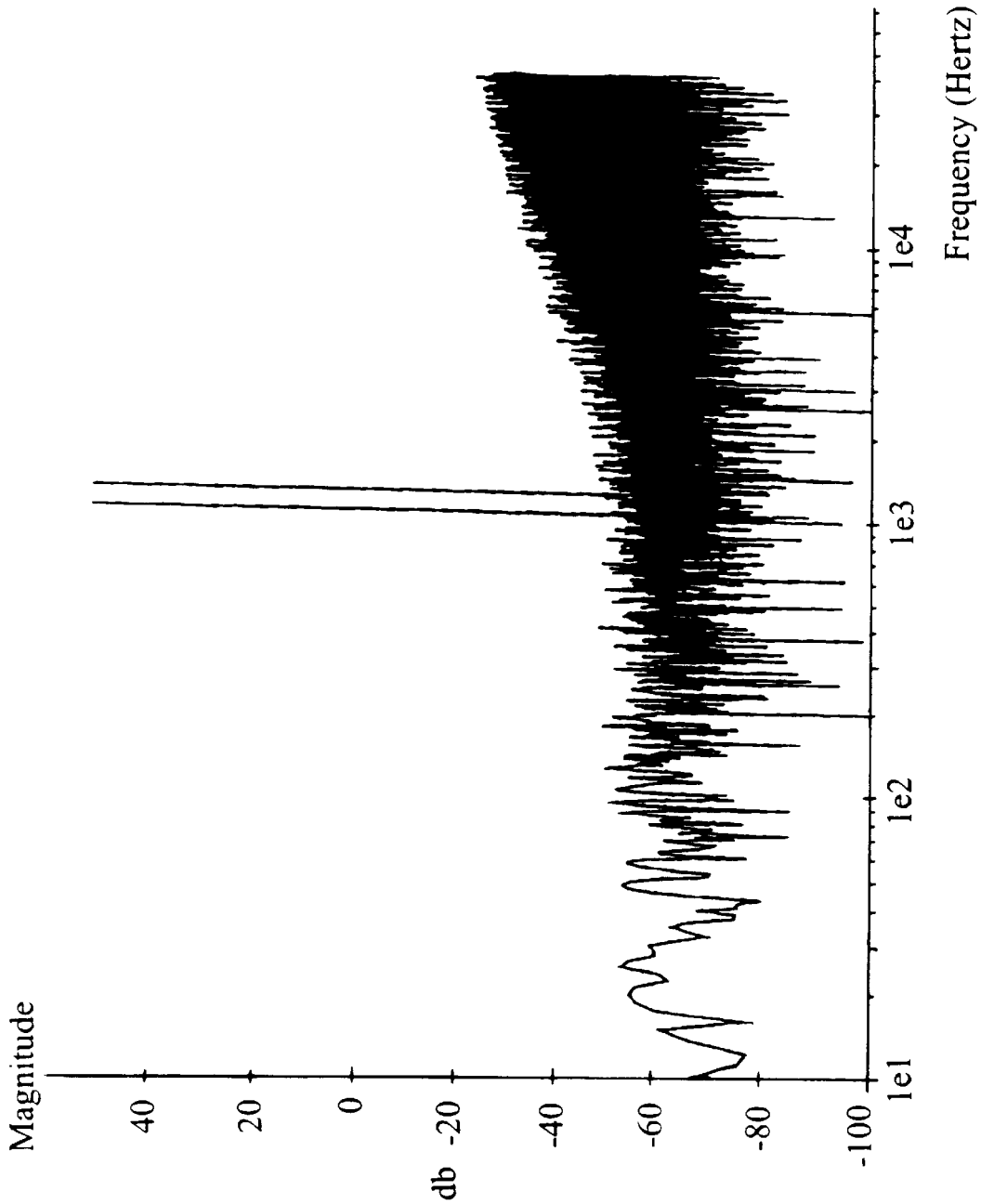
FIG. 6 shows a simulated output spectrum of the DAC of FIG. 5.

FIG. 6 shows the simulated output spectrum of the DAC of FIG. 5, with 1% random mismatch in the element values. The first order shaping of the mismatch noise is evident.

An alternative embodiment, similar to that described in the previous example, uses a carry function instead of a borrow function. In this alternative embodiment, step d) is replaced by the alternative step of
e) If the cycle rate of any subDAC rises above 50%, then it carries a LSB to the adjacent, more significant DAC.

This carry operation increases the adjacent DAC code by one. If this carry operation increases the adjacent code above two, then the adjacent DAC must in turn carry one to the next higher DAC.

Figure 7:
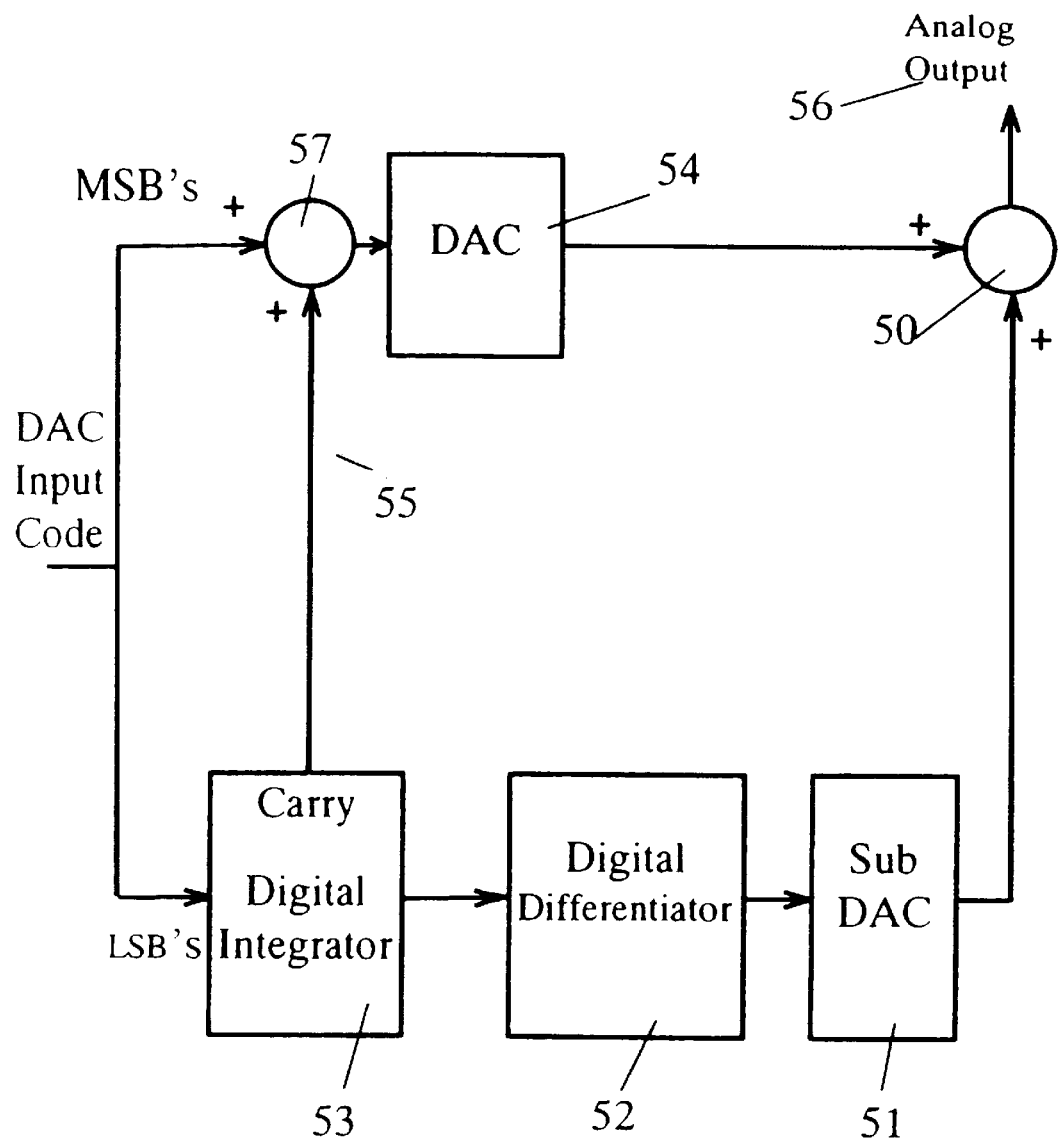
FIG. 7 shows an alternative embodiment of the present invention.

FIG. 7 shows one possible structure for implementation of a carry function according to the present invention, comprising an integrator, a main DAC, a subDAC and a differentiator.

The input code of the DAC is split into the MSBs and the LSBs, with the MSBs allocated to the main DAC 54 and the LSBs inputted to a digital integrator 53. The output of the digital integrator 53 is applied to the differentiator 52. The output of the differentiator 52 is allocated to the input of the subDAC 51. Alternatively, the differentiator 52 may be implemented in the subDAC 51. The carry function 55 is implemented as the overflow from the digital integrator. This overflow is added to the MSB's in a summer 57 prior to the main DAC 54.

The outputs from the DAC and subDAC are summed together (50) to produce an analog output 56. The outputs from the digital integrator may be split into different parallel paths, with each path having an differentiator and subDAC combination and having a different binary weighting. The outputs of the subDACs are summed with the output of the main DAC to produce a corresponding analog output. As the differentiator may produce a −1, 0 or 1 output, a conventional R-2R structure may not serve to implement the individual sub-DACs. However, the parallel paired R-2R structure shown in FIG. 5 may be used to implement the three slates, using an offset. For example, when the output of a differentiator is −1, neither of the corresponding paired switches in the R-2R ladder are switched to the reference voltage, i.e. both are off. When the output of a differentiator is 0, one of the corresponding paired switches in the R-2R ladder is switched to the reference voltage. When the output of a differentiator is 1, both of the corresponding paired switches in the R-2R ladder are switched to the reference voltage.

In this preferred embodiment, the subDAC may be implemented in an R-2R fashion, with the step of differentiation implemented in the control logic of the R-2R structure. In this embodiment, the circuitry required is reduced.

In summary therefore, DACs with more than one level of element weighting are commonly used if the resolution exceeds six bits. The present invention provides an algorithm for noise shaping the element mismatch in such DACs. Three examples have been presented. In the first two examples, the elements have two different weightings. In the second, a 12 bit DAC is comprised of 24 elements with twelve different weightings for the elements. In all cases, the element selection logic ensures that errors are shaped away from the converter base band.

In will be readily apparent to those skilled in the art that the DACs and subDACs described herein may be implemented directly without difficulty using standard components and circuit topologies. In addition, the logic elements of the system may be implemented in accordance with conventional and known procedures and conventions. Ideally, the embodiments described herein should be constructed as part of an integrated circuit structure rather than as discrete circuits.

Having thus described several illustrative embodiments of the invention, various alterations, modifications, and improvements will be apparent to those skilled in the art. Such alterations, modifications, and improvements are intended to be encompassed within the scope and spirit of the invention. Accordingly, the foregoing description is by way of example only and is not intended as limiting. The present invention is only limited by the claims appended hereto and their equivalents.

What is claimed is:

1. A data conversion system comprising a digital to analog converter for converting a digital input code to analog output, wherein the digital to analog converter comprises a plurality of selectable segments, at least two of which have a first weighting factor and two of which have a second weighting factor, the segments when selected being connected to a reference signal, such that the output for a segment, when selected, is proportional to the weighting factor of that segment, the number of segments having the second weighting factor being equal to at least twice the ratio of the first and second weighting factors less one, selection means for selecting segments based on the digital input, summing means for adding the output from each selected segment to produce an analog output, monitoring means for monitoring the number of times segments having the second weighting factor are selected in a given monitoring period and for generating a correction signal when this number diverges from a specified target value, and correcting means responsive to said correction signal of the monitoring means to adjust the number of segments selected having the first weighting factor and to adjust the number of segments selected having the second weighting factor by an equivalent amount.

2. A data conversion system according to claim 1, wherein the correcting means is implemented as a carry means and is responsive to said correction signal of the monitoring means indicating that said number has risen above a specified target selection value to increase the number of segments selected having the first weighting factor and reduce the number of segments selected having the second weighting factor.

3. A data conversion system according to claim 2, wherein the digital to analog converter is implemented as at least two R-2R networks in parallel.

4. A data conversion system according to claim 2, wherein the selection means further comprises an integrator and a differentiator and the carry means is implemented as a digital overflow from the integrating means.

5. A data conversion system according to claim 1, wherein the correcting means is implemented as a borrow means and is responsive to said correction signal of the monitoring means indicating that said number has fallen below said specified target selection value to reduce the number of segments selected having the first weighting factor and increase the number of segments selected having the second weighting factor.

6. A data conversion system according to claim 1, wherein the target selection value is 50%.

7. A data conversion system according to claim 1, wherein the digital input comprises a series of input codes and the monitoring period is equal to the duration of two input codes.

8. A data conversion system according to claim 1, wherein each digital input code is offset by a fixed digital offset prior to conversion.

9. A data conversion system according to claim 8, wherein said fixed digital offset is equal to the ratio of the values of the first and second weighting factors.

10. A data conversion system according to claim 1, wherein the segments having said first weighting factor are selected in a cyclic sequence.

11. A data conversion system according to claim 1, wherein the segments having said second weighting factor are selected in a cyclic sequence.

12. A data conversion system according to claim 1, wherein the segments having said second weighting factor are selected in a thermometer fashion.

13. A data conversion system according to claim 1, wherein segments of said plurality of segments have at least one further weighting factor and selection of segments is effected in accordance with claim 1 from segments having any two of said first, second and further weighting factors.

14. A data conversion system according to claim 1, wherein the data conversion system defines an analog to digital converter.

15. A data conversion system according to claim 1, wherein the data conversion system defines a digital to analog converter.

16. A data conversion system comprising a digital to analog converter for converting a digital input to analog output, wherein the digital to analog converter comprises;

a plurality of selectable segments, at least two of which have a first weighting factor and at least two of which have a second weighting factor, the segments when selected being connected to a reference signal, with the output for each segment, when selected, being proportional to the weighting factor of that segment, and the number of segments having the second weighting factor being equal to at least twice the ratio of the first and second weighting factors less one, selection means for selecting segments based on the digital input, summing means for adding the output from each selected segment to produce an analog output, monitoring means for monitoring the number of times segments having the second weighting factor are selected in a given monitoring period and for generating a correction signal when this number drops below a specified target selection value, borrow means responsive to said correction signal of the monitoring means to reduce the number of segments selected having the first weighting factor and increase the number of segments selected having the second weighting factor.

17. A data conversion system according to claim 16, wherein the target selection value is 50%.

18. A data conversion system according to claim 16, wherein the digital input code comprises a series of input codes and the monitoring period is equal to the duration of two input codes.

19. A data conversion system according to claim 18, wherein each digital input code is offset by a fixed digital offset prior to conversion.

20. A data conversion system according to claim 19, wherein said fixed digital offset is equal to the ratio of the values of the first and second weighting factors.

21. A data conversion system according to claim 16, wherein the segments having said first weighting factor are selected in a cyclic sequence.

22. A data conversion system according to claim 16, wherein the segments having said second weighting factor are selected in a cyclic sequence.

23. A data conversion system according to claim 16, wherein the segments having said second weighting factor are selected in a thermometer fashion.

24. A data conversion system comprising a digital to analog converter for converting a digital input to analog output, wherein the digital to analog converter comprises;
   a plurality of segments which when selected are connected to a reference signal, each segment having a weighting factor, there being at least three weighting factors, and the selection of segments having at least two of the weighting factors being in accordance with claim 16.

25. A data conversion system comprising a digital to analog converter for converting a digital input code to analog output, wherein the digital to analog converter comprises a main DAC and a subDAC, with the main DAC converting the MSBs of the digital input code and the subDAC converting the remaining bits (LSB's) of the digital input code, wherein the subDAC comprises
   two R-2R networks in parallel, each R-2R network having a series of selectable switches, each switch having a different binary weighting,
   subDAC control means adapted to select said selectable switches in response to the digital input code, and
   summing means adapted to sum the resulting output of each selectable switch and the main DAC to produce an analog output.

26. A data conversion system according to claim 25, comprising a digital integrator for integrating the remaining bits of the input code prior to conversion by the subDAC,
   said digital integrator providing an overflow value which is summed with the MSB's prior to conversion by the main DAC,
   wherein the subDAC control means includes a differentiator for differentiating the output from the integrator.

* * * * *